(12) United States Patent
Wieduwilt et al.

(10) Patent No.: US 10,984,884 B2
(45) Date of Patent: Apr. 20, 2021

(54) CONFIGURABLE ASSOCIATED REPAIR ADDRESSES AND CIRCUITRY FOR A MEMORY DEVICE

(71) Applicant: Micron Technology, Inc., Boise, ID (US)

(72) Inventors: Christopher Gordon Wieduwilt, Boise, ID (US); Kevin Gustav Werhane, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 16/388,847

(22) Filed: Apr. 18, 2019

(65) Prior Publication Data

US 2020/0335175 A1 Oct. 22, 2020

(51) Int. Cl.
*G11C 29/44* (2006.01)
*G11C 29/24* (2006.01)
*G11C 29/12* (2006.01)

(52) U.S. Cl.
CPC .......... *G11C 29/4401* (2013.01); *G11C 29/24* (2013.01); *G11C 2029/1202* (2013.01); *G11C 2029/1204* (2013.01)

(58) Field of Classification Search
CPC ................ G11C 29/4401; G11C 29/24; G11C 2029/1204; G11C 2029/1202
See application file for complete search history.

(56) References Cited

U.S. PATENT DOCUMENTS

| 5,706,292 A * | 1/1998 | Merritt ................ | G11C 7/1006 365/201 |
| 2009/0100291 A1* | 4/2009 | Blodgett .............. | G11C 29/808 714/6.32 |
| 2014/0078842 A1* | 3/2014 | Oh ....................... | G11C 29/785 365/200 |

* cited by examiner

Primary Examiner — Mohammed A Bashar
(74) Attorney, Agent, or Firm — Fletcher Yoder, P.C.

(57) ABSTRACT

A memory device includes a memory bank having multiple addressable groups of memory cells. The multiple addressable groups of memory cells include a primary set of addressable groups and a secondary set of addressable groups. The memory bank has a control circuitry that activates an addressable group with the control circuitry including repair address match circuitry that includes dynamic selection circuitry having multiple first inputs that receive row address values corresponding to the primary set. The dynamic selection circuitry includes one or more second inputs configured to receive one or more fused address values corresponding to the secondary set of addressable groups. The dynamic selection circuitry includes an output configured to selectively transmit a result that is based at least in part on a selection of one or more first inputs and a comparison of the selected one or more first inputs with the one or more the second inputs.

20 Claims, 9 Drawing Sheets

CONFIGURABLE ASSOCIATED REPAIR ADDRESSES AND CIRCUITRY FOR A MEMORY DEVICE

BACKGROUND

1. Field of the Present Disclosure

This disclosure relates to memory devices, and more particularly, to methods and systems capable of performing repair (e.g., post-package repair (PPR) and/or other repairs) for memory devices.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operation and/or facilitate data storage that may facilitate data processing operations. To that end, these memory devices may have multiple memory cells that can each store one or more bits of information. The memory cells may be arranged in addressable groups (e.g., rows or columns) within a memory array of a memory bank. When a memory controller receives a request to access a row or column, such as when performing a read or write operation, the memory controller may activate access to the row and/or column of memory cells.

Due to manufacturing errors and/or failures, certain memory cells may be defective. Quality control testing may be used to identify rows and/or columns containing such defective memory cells. If the number of defective memory cells is small, a pre-packaging re-assignment of memory cells may be used to prevent discarding of otherwise functional devices. In such systems, additional addressable data cells (e.g., redundant rows and/or columns) may be made available during manufacturing and the address associated with a defective row and/or column may be reassigned to a redundant row and/or column. Such reassignment may be hard-wired. For example, the reassignment information may be stored in a non-volatile storage device (e.g., blowing fuses or antifuses disposed within the memory device). Due to the non-volatility of the storage device, such operation may not be easily reversible and/or may permanently consume resources that may be used for future repairs.

In the course of usage of the memory device, other memory rows and/or columns may fail and present defective cells. In order to increase the lifetime of the memory devices in the presence of these defects, repair methods, such as PPR methods, may be employed to repair the memory device. Methods and systems to perform repairs may include reassignment of the address associated to a row and/or column. For example, soft PPR (sPPR) methods may be used to perform this reassignment. sPPR may be used to perform this reassignment without blowing antifuses and sPPR reassignment solutions may be lost without power (e.g., when power is removed). Some repairs may conflict with each other. For instance, the information associated with the reassignment may conflict with other PPR methods, such as hard PPR (hPPR) methods. In contrast with sPPR methods, hPPR methods include techniques whereby the memory device may internally blow reassignment antifuses to maintain the reassignment solution in the absence of power.

BRIEF DESCRIPTION OF THE DRAWINGS

Various aspects of this disclosure may be better understood upon reading the following detailed description and upon reference to the drawings in which.

DETAILED DESCRIPTION

Figure 1:
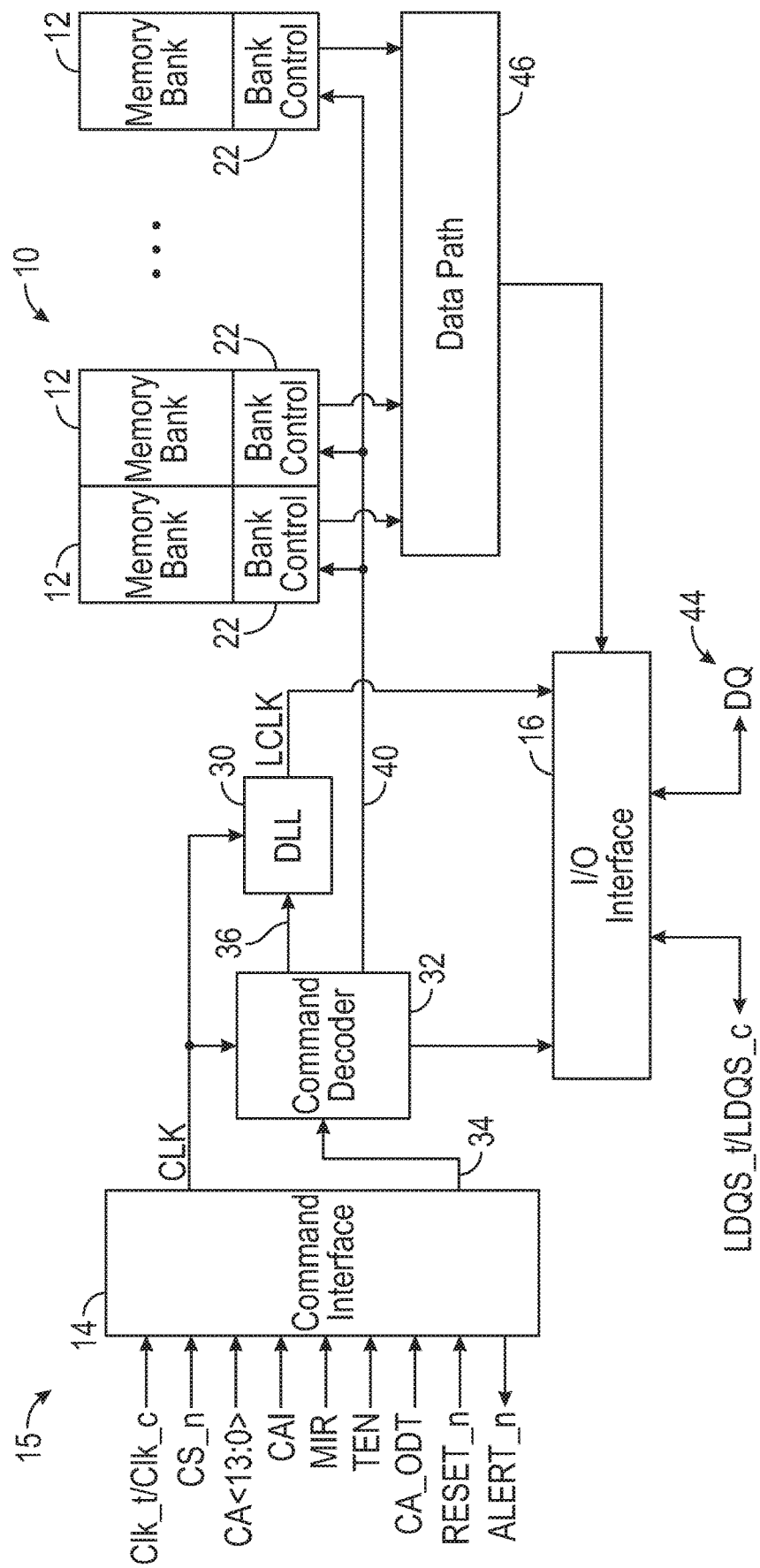
FIG. 1 is a block diagram illustrating an organization of a memory device that includes memory bank control circuitry that may implement memory repair (e.g., post-package repair (PPR) and/or other repairs) using redundant rows of memory cells, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories. In such systems, the memory cells may be grouped in memory arrays, which may be addressed in groups (e.g., rows and/or columns). In the present application, the descriptions of the embodiments are related to memory arrays containing memory cells organized in rows (e.g., data rows). It should be understood that the methods and systems described herein may be used in memory devices having memory cells organized in columns.

During certain operations, such as reading and writing operations, a controller in the memory device may receive an address for a memory cell. The memory device controller may determine which memory bank contains the requested memory cell and request access from the corresponding memory bank controller. In turn, the memory bank controller may identify and activate the data row containing the requested memory cell, to perform the requested operation. In certain memory devices, the memory bank may include additional data rows, which may be redundant rows that may be used for memory repairs, such as post-package repair (PPR), as detailed below. Following manufacturing, defective rows (e.g., data rows containing defective cells) may be identified during pre-package tests. If a defective row is identified, the defective row may be deactivated and a redundant row may be used in its place. To that end, a non-volatile memory system may store information such as the assigned address of the defective row, and the address of the redundant row to be used in its place. Such repair is described herein as redundant row repair. Redundant row repair may occur while a memory device is still with the manufacturer. Further repair of data rows may take place in the field, for example, as post-package repair by assigning a defective row to a PPR row. Although the following discussion contemplates applying address duplication as part of PPR, some embodiments of memory devices may apply the techniques described herein to other repair techniques in addition to or alternative to PPR repairs.

Post-package repair (PPR) may be a hard post-package repair (hPPR), or soft post-package repair (sPPR) and may also be performed while the memory device is with the manufacturer. PPR may additionally and/or alternatively be performed while the memory device is in the hands of the user or consumer (while, for example, other types of repair including those discussed above are typically not available to the user or customer). hPPR or sPPR may take place by storing the address of a defective row in a memory and rerouting requests from the defective row to a PPR row.

Existing memory device designs may not match sPPR with hPPR row addresses, which compromises manufacturing yield. For example, sPPR and/or hPPR addresses may be limited by the type of the memory device used, the specifications of the memory device, by customer requirements, etc. For example, the Joint Electron Device Engineering Council (JEDEC) double data rate fourth-generation (DDR4) synchronous dynamic random-access memory (SDRAM) associated address specification may not match manufacturing testing and repair techniques, which may lead to different addresses being repaired between sPPR and hPPR, when a manufacturing repair technique, for example, does not meet the JEDEC DDR4 sPPR associated address specification. One manner to overcome this deficiency is to utilize a fuse-backed selection (e.g., an address match selection fuse) of which row address matches the configuration used for the PPR row elements in every DRAM bank. DRAM bank logic may include row address match circuits that correspond to redundant row repair, sPPR, and hPPR. By utilizing the address match selection fuse, it is possible to dynamically optimize for manufacturing yield.

DRAM products are designed so that repair is duplicated for specific row or column addresses, for simplifying compression, for repair algorithms, and/or match circuits. As previously discussed, all or multiple addresses may be configured to maximize yield in addition to just one address on one repair to maintain PPR spec compatibility. In other words, by providing a flexible repair solution that extends beyond PPR, secondary duplicated repairs may possibly repair more defects than may be repaired in traditional PPR repairs. The flexible repair solution enables tailoring the duplicated addresses for all repairs per die to maximize the chance of repairing multiple defects with secondary duplicated repairs potentially further increasing a yield benefit. This flexibility may be particularly beneficial with systematic defects that may repeat in a predictable way, such as defects at edge rows of a section of a memory bank that may be targeted in a repair.

Multiple repairs may be performed on a single memory bank. For example, in-house (manufacturer or supplier) redundant repair and PPR (e.g., hPPR) customer repairs may both be undertaken, however, in some situations, the addresses that are used in these repairs may need to be different. Accordingly, it may be advantageous to provide a way of choosing which type of repair one or multiple address match circuits are being used for. In this manner, a different repair solution may be chosen (e.g., undertaken) depending on the state of a selection fuse, which generally answers whether an address match circuit is available for customer PPR or whether the address match circuit is already used for in-house (e.g., redundant) repair. The state of the selection fuse enables selection of which usage is applied to an address match circuit and selects which addresses to compare to create a correct repair solution. For example, in some embodiments, a repeat repair may be performed for both states of RA2 or repeat repair may be performed for both states of RA15.

Turning now to the figures, FIG. 1 is a simplified block diagram illustrating certain features of a memory device 10. Specifically, the block diagram of FIG. 1 is a functional block diagram illustrating a DRAM memory device 10 that may perform repairs (e.g., PPR) in redundant rows. In accordance with one embodiment, the memory device 10 may be a DDR4 SDRAM device, a double data rate type five (DDR5) SDRAM device (which may, for example, allow for reduced power consumption, more bandwidth, and more storage capacity compared to prior generations of DDR SDRAM), low power DDR4 (LPDDR4), LPDDR5, and other memory devices that utilize customer PPR.

The memory device 10 may include a number of memory banks 12. The memory banks 12 may be DDR4 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. The memory chip (i.e., memory device 10) may be used in non-module type application, for example, as a single die, which may be used, for example, in many mobile applications.

Each SDRAM memory chip may include one or more memory banks 12. The memory device 10 represents a portion of a single memory chip (e.g., SDRAM chip) having a number of memory banks 12. For DDR4, the memory banks 12 may be further arranged to form bank groups. For instance, for an 8 gigabyte (GB) DDR4 SDRAM, the memory chip may include 16 memory banks 12, arranged into 8 bank groups, each bank group including 2 memory banks. For a 16 GB DDR4 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10. As an example of signals 15, the processor or controller may request a read and/or write operation by providing the corresponding command and an address via the CA bus.

The command interface 14 may receive one or more clock signals from an external device. Generally, double data rate (DDR) memory utilizes a clock signal referred to herein as a Clk signal 52, which may be provided as a differential pair formed by the true clock signal (Clk_t) and the complementary clock signal (Clk_c). The positive clock edge for Clk signal 52 in DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK may be supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands.

Further, the command decoder 32 may decode commands, such as read commands, write commands, mode-register set commands, activate commands, etc., and provide access to a particular memory bank 12 corresponding to the command, via the bus 40. As will be appreciated, the memory device 10 may include various other decoders, such as row decoders and column decoders, to facilitate access to the memory banks 12. In one embodiment, each memory bank 12 includes a bank control circuitry 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address (CA) bus may be a 14-bit bus to accommodate the command/address signals (CA<13:0>). The command/address signals are clocked to the command interface 14 using the clock (Clk_t and Clk_c), as discussed above. Access to specific memory banks 12 within the memory device 10 is encoded on the CA<13:0> bus with the commands. As an example, a processor requesting data from memory device 10 may provide a CS enable signal via an input pin to inform the memory device 10 that it should operate on the CA signal available in the bus. To this end, the command interface 14 and/or the command decoder 32 may receive the CA signal to identify the command and the target memory banks 12 associated with the address in the CA signal. The command decoder 32 may, via the bus 40, request the bank control circuitry 22 associated with the target memory bank 12 to activate a data row or data column associated with the requested address in the CA signal. Based on the command received via bus 40, the bank control block may cause the memory banks 12 to provide the requested data via data path 46 and I/O interface 16 or to store in the memory banks 12 data available in the data path 46, received via I/O interface 16.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/and DQS_c) to provide differential pair signaling during reads and writes.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
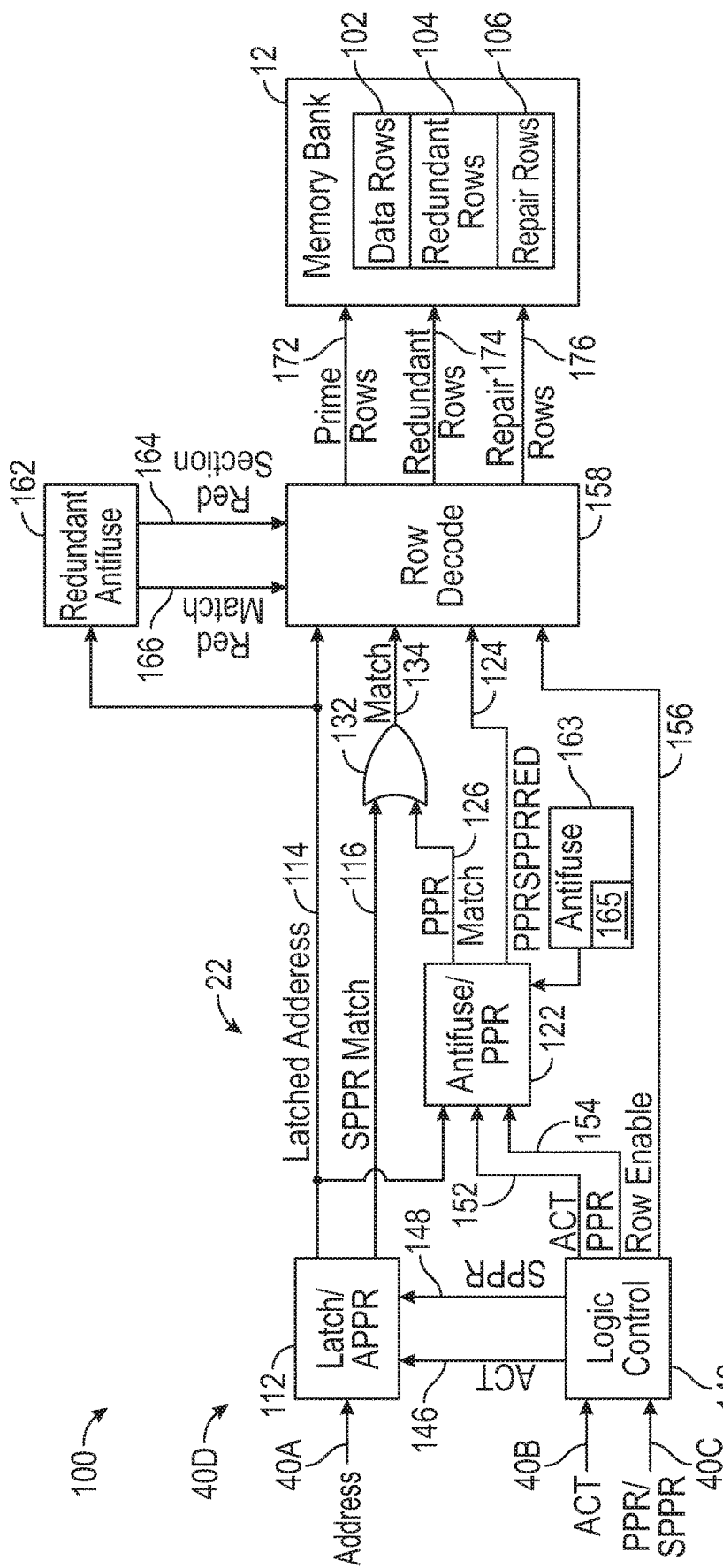
FIG. 2 is a block diagram illustrating the memory bank control circuitry of FIG. 1 that may perform the memory repairs using the redundant rows, in accordance with an embodiment.

FIG. 2 illustrates row selection circuitry 100 that may be disposed in the bank control circuitry 22 that controls a memory bank 12. The memory bank 12 may include an array of memory cells, which may be arranged in rows and/or columns. In the illustrated example, memory cells in memory bank 12 are arranged in data rows 102 (e.g., primary data cells), redundant rows 104 (e.g., used to repair using a first one or more repair technique types), and repair rows 106 (e.g., secondary data cells used for repair using a second one or more repair technique types), together which may be referred to as addressable groups of memory cells. In this memory bank 12, the data rows 102 include the memory cell rows initially assigned for regular operation during production and redundant rows 104 include additional memory cell rows that may be used during pre-package repair and/or in post-package repair by the manufacturer (i.e., prior to receipt and use by the customer/user), as discussed above (e.g., repair(s) performed by a non-customer or non-end-user). The repair rows 106 may be additional memory cell rows available for usage in soft post-package repair or hard post-package repair (e.g., repair performed by a customer). As detailed below, data rows 102 may be directly addressed by prime row activation lines, redundant rows 104 may be selected by redundant row selection lines and repair rows 106 may be activated by PPR selection lines. In some memory devices, redundant rows 104 and repair rows 106 may be a single group of memory cell rows with a shared address scheme.

Row selection circuitry 100 may receive an address signal 40A, an activation (ACT) signal 40B, and a sPPR/hPPR signal 40C. Based on the address contained in the address signal 40A, row selection circuitry may activate a corresponding prime data row 102, if that row has not been repaired. If the row has been repaired, either via the redundant row mechanism, performed in the hands of the manufacturer or supplier (even if performed after packaging), or via the hPPR or the sPPR performed after packaging (e.g., by the customer), row selection circuitry 100 may prevent activation of the corresponding defective prime data row 102 and may activate the repaired row (e.g., the redundant row 104 or the repair row 106) reassigned to be used in place of the defective prime data row 102. To perform and/or identify an sPPR repair, the sPPR circuitry 112 may be used. During an sPPR repair operation, the sPPR circuitry 112 may store the received address in address signal 40A in a local volatile memory, to perform sPPR. In some embodiments, the sPPR circuitry 112 may instead be disposed away from the memory bank 12 (i.e., in remote volatile memory), for example, based upon specifications of the memory device 10.

During regular operation (i.e., not during a repair), sPPR circuitry 112 receives and latches the address signal 40A to produce a latched address 114, that may be used by other circuitry in the row selection circuitry 100. Moreover, if the sPPR circuitry 112 determines that the address in the address signal 40A matches the stored address, the sPPR circuitry may provide a sPPR match signal 116 to indicate that the received address signal 40A corresponds to a row repaired via sPPR.

To perform and/or identify hPPR repair, hPPR circuitry 122 may be used. During an hPPR repair operation, the hPPR circuitry 122 may store the latched address 114 in a local non-volatile memory, which may be write-once internal memory devices (e.g., antifuse banks). In some embodiments, each non-volatile memory cell may be associated with a repair row 106. During regular operation (i.e., not during a repair), hPPR circuitry 122 may compare the latched address 114 with the address stored in the antifuse banks and, if a match appears, provide a corresponding PPR row address 124 and a hPPR match signal 126. A logic element 132 (e.g., OR gate) may combine an sPPR match signal 116 and an hPPR match signal 126 to produce a match signal 134. During regular operation, the match signal 134 indicates that the address signal 40A contains an address that was repaired via hPPR and/or sPPR.

Controller logic 142 in the row selection circuitry 100 may be used to manage the operation of sPPR circuitry 112 and hPPR circuitry 122. Controller logic 142 may receive, via sPPR/hPPR signal 40C, instructions to indicate that the customer is requesting a post-package repair (e.g., an hPPR or a sPPR). In some embodiments, the sPPR/hPPR signal 40C may be an instruction that specifies the mode of post-package repair. In some embodiments, the sPPR/hPPR signal 40C may be an instruction requesting a repair to be performed without specifying a specific mode of post-package repair. Controller logic may also receive the ACT signal 40B, that may include an activation trigger (e.g., an activating edge) that synchronizes the operations associated with data row activation and/or data row repair. When the controller logic 142 requests a sPPR, the controller logic 142 may send an ACT signal 146 and an sPPR signal 148 to the sPPR circuitry 112. When the controller logic 142 requests an hPPR, it may send an ACT signal 152 and an hPPR signal 154 to the hPPR circuitry 122.

Controller logic 142 may also provide an activating row enable signal 156 to a row decoder 158 to trigger an activation of memory cell rows. Row decoder 158 may receive the latched address 114, the PPR row address 124, the match signal 134 and the row enable signal 156, described above. The row decoder 158 may be further coupled to redundant repair circuitry 162, which may store address repaired pre-packaging. Redundant repair circuitry 162 may compare a received latched address 114 with internal non-volatile memory cells (e.g., antifuse banks). If a match is identified (i.e., the latched address 114 is associated with a redundant row 104), redundant repair circuitry 162 may provide the redundant row address 164 associated with the latched address 114, and assert the redundant match signal 166. In some embodiments, the redundant repair circuitry 162 and the hPPR circuitry 122 functionalities may be provided by a single repair circuitry that includes non-volatile memory storing repaired addresses matched to redundant rows 104 and/or repair rows 106 and/or by an antifuse circuit 163. Additionally, in some embodiments, the antifuses from each of the redundant repair circuitry 162 and hPPR circuitry 122 may be disposed in the antifuse circuit 163, which may be a centralized location (grouping) of the fuses described above. In some embodiments, the antifuse circuit may include one or more extra fuses that may be used for repair functionality other than those using the redundant repair circuitry 162 and the hPPR circuitry 122, such as an address match selection fuse 165, which, are not used, for example, in connection with the redundant repair circuitry 162 and the hPPR circuitry 122 functionalities.

The row decoder 158, detailed below, may receive the latched address 114, repair match information (e.g., match signal 134 and redundant match signal 166), repair address (e.g., PPR row address 124 and redundant row address 164), and a triggering row enable signal 156, and activate specific data rows. If the latched address corresponds to a prime data row 102 that has not been repaired, the row decoder 158 may activate the prime row (i.e., the prime data row 102 assigned during manufacturing) via prime row signal 172. If the latched address 114 corresponds to a redundant row 104, the row decoder 158 may activate the associated redundant row 104 using a redundant row address bus 174. If the latched address 114 corresponds to a post-package repaired row 106, the row decoder 158 may activate the associated PPR row using a repair row address bus 176. Row selection circuitry 100 may implement an overriding or trumping mechanism for operation. For example, JEDEC specifications may require sPPR to trump hPPR, while hPPR trumps the supplier's redundant row repair. Such a mechanism obviates the requirement for overriding redundant row repairs in the process of performing hPPRs and/or sPPRs, as the non-volatile memory in redundant repair circuitry 162 does not need to be modified.

Figure 3:
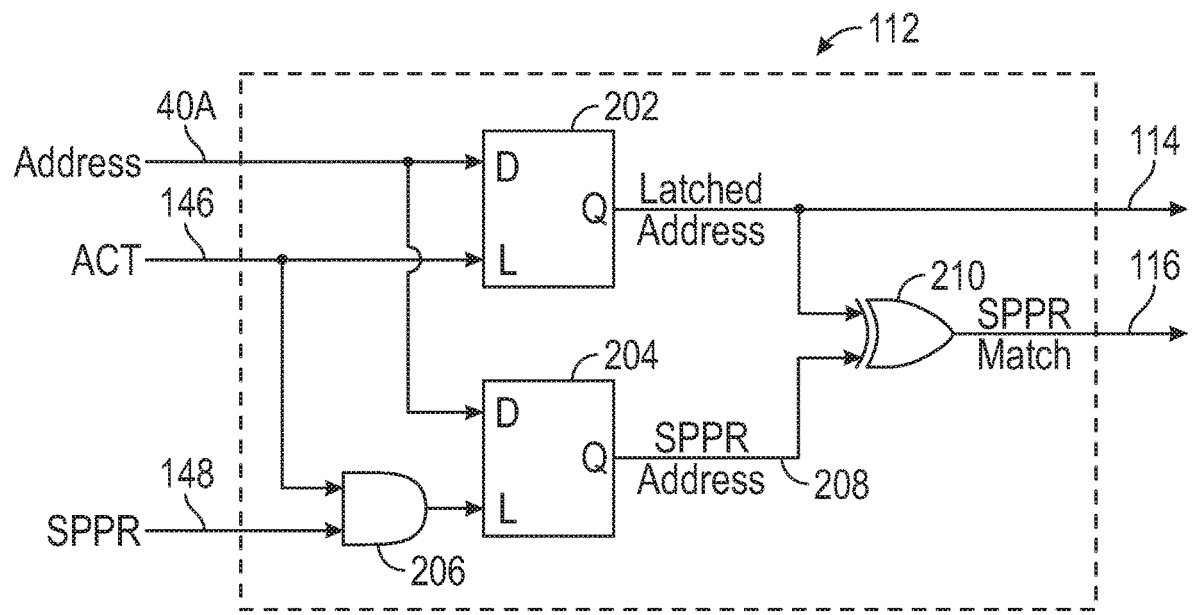
FIG. 3 is a block diagram illustrating a soft PPR (sPPR) latch circuitry that may be used by memory bank control circuitry such that of FIG. 2, in accordance with an embodiment.

FIG. 3 illustrates the sPPR circuitry 112. As previously discussed, the sPPR circuitry 112 may receive an address signal 40A and a triggering ACT signal 146. A latch 202 may store the address in the address signal 40A, as triggered using the ACT signal 146, to provide the latched address 114. An sPPR latch 204 may be used to store an address to perform sPPR, as triggered by the sPPR signal 148. By asserting the sPPR signal 148, the sPPR circuitry may enter an sPPR mode. The address to be repaired may be provided via address signal 40A. The logic element 206 (e.g., an AND gate) may combine the triggering ACT signal 146 and the asserted sPPR signal to make the sPPR latch 204 transparent. In the transparent state, the sPPR latch 204 may store the address to be repaired. Once the sPPR signal 148 is deasserted, the sPPR latch 204 may store the repaired address. During regular operation, the sPPR latch 204 is not transparent, and may provide the sPPR address 208. A logic element 210 (e.g., XOR gate) may compare the stored sPPR address with the latched address 114. If the address matches (e.g., all bits of the latched address 114 are the same as the bits of the sPPR address 208), the sPPR match signal 116 may be asserted.

Figure 4:
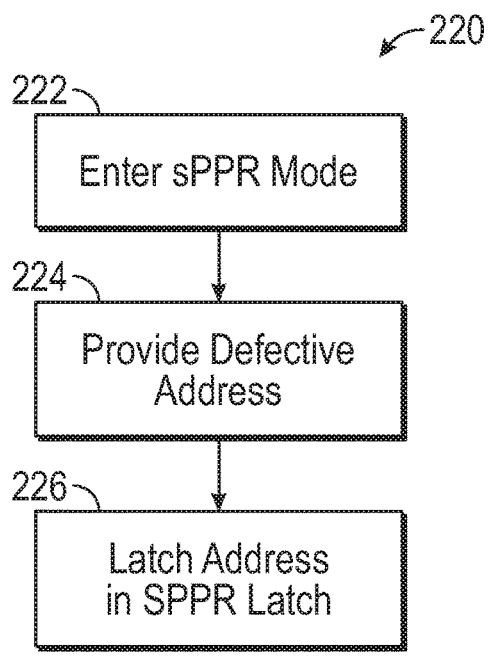
FIG. 4 is a method to perform a repair, in accordance with an embodiment.

FIG. 4 illustrates a flow diagram of a method 220 for performing sPPR using the sPPR circuitry 112. The sPPR circuitry 112 enters the sPPR mode (block 222). The address to be repaired may be provided via the address signal 40A (block 224). In the previously discussed transparent state, the sPPR latch 204 may store the address to be repaired (block 226).

Figure 5:
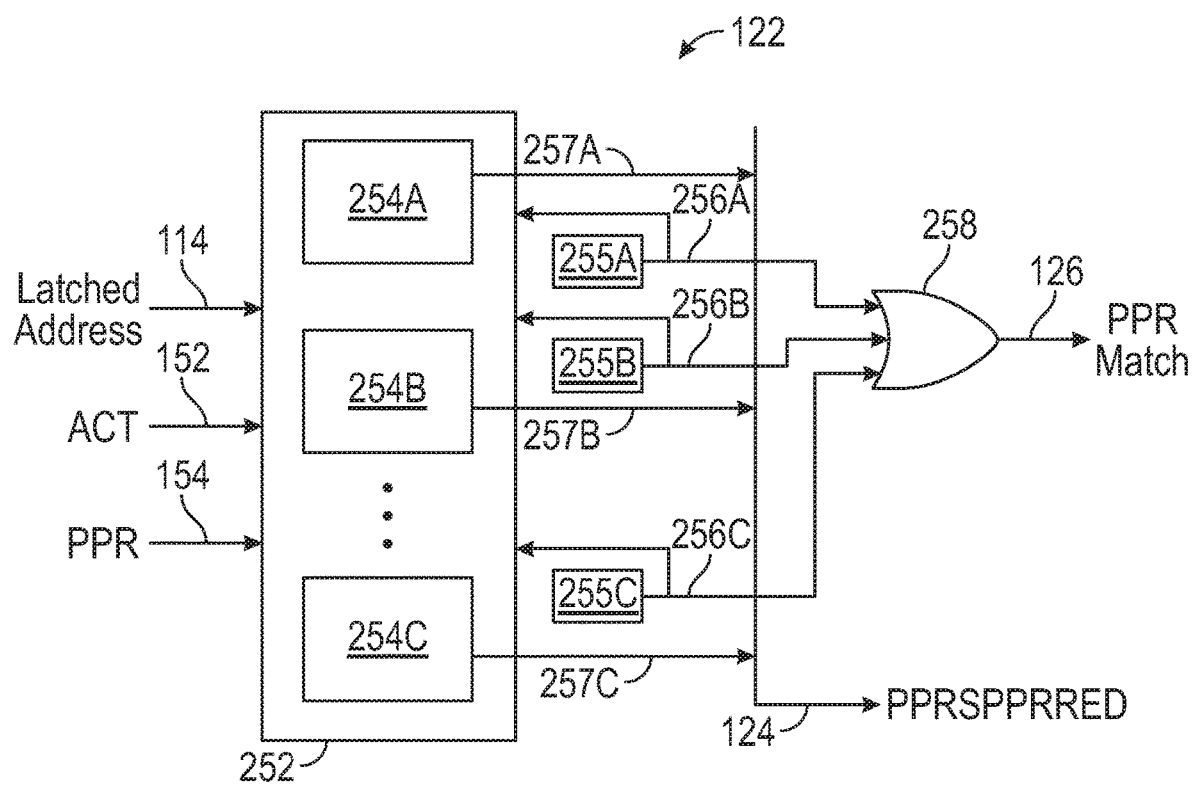
FIG. 5 is a block diagram illustrating hard PPR (hPPR) storage circuitry, that may be used by memory bank control circuitry such as that of FIG. 2, in accordance with an embodiment.
Figure 6:
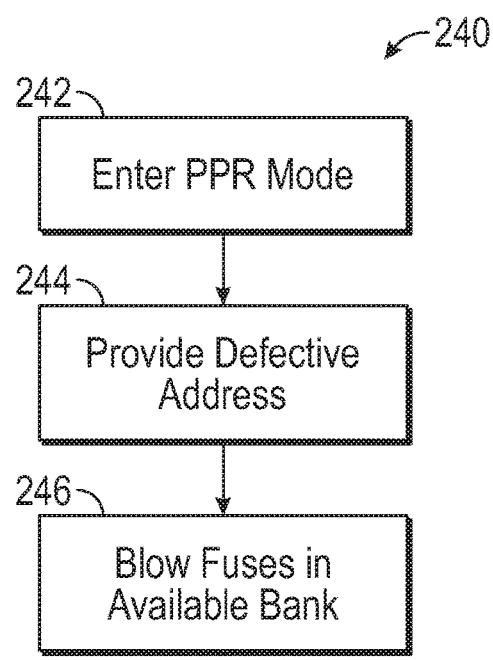
FIG. 6 is a method to perform hPPR, in accordance with an embodiment.

FIG. 5 illustrates the hPPR circuitry 122, and FIG. 6 illustrates a method 240 for performing hPPR using the hPPR circuitry 122. In the illustrated hPPR circuitry 122, any number of non-volatile storage or antifuse banks 252 may be present and, for example, the illustrated antifuse banks 254A, 254B, and 254C may be disposed therein. Each antifuse bank 254 may be a write-once memory device. As illustrated in the method 240 of FIG. 6, to enter the hPPR operation (e.g., block 242), the hPPR circuitry 122 may receive a hPPR signal 154 and a triggering ACT signal 152. The hPPR circuitry 122 may also receive the latched address 114 to be repaired (block 244). Upon receiving the ACT signal 152, the hPPR circuitry 122 may blow fuses of the antifuse banks 252 to store the latched address 114 of one or more defective data rows 102 (block 246).

Returning to FIG. 5, the hPPR circuitry 122 may additionally include repair address match circuitry 255A, 255B, and 255C. In some embodiments, the repair address match circuitry 255A, 255B, and 255C may correspond to each of the antifuse banks 254A, 254B, and 254C and may operate to generate match signals 256A, 256B, and 256C, respectively, as will be described in greater detail below with respect to FIGS. 7 and 8. Match signals 256A, 256B, and 256C may represent the results of a comparison of the latched address 114 with the address stored in the respective antifuse banks 254A, 254B, and 254C. A logic element 258 (e.g., OR gate) may combine the match signals 256A, 256B, 256C, etc., to form a single hPPR match signal 126, described above.

In some embodiments, each antifuse bank may be associated with a repair row 106. In such embodiment, if a match occurs, the repair address match circuitry 255A, 255B, or 255C can cause the transmission of an address 257A, 257B, or 257C, respectively from the antifuse banks 252. For example, the repair address match circuitry 255A may transmit the match signal 256A to the antifuse banks 252 (or to the antifuse bank 254A) to cause the antifuse bank 254A to provide an address 257A as the PPR row address 124. Similarly, the repair address match circuitry 255B may transmit the match signal 256B to the antifuse banks 252 (or to the antifuse bank 254B) to cause the antifuse bank 254B to provide an address 257B. Likewise, the repair address match circuitry 255C may transmit the match signal 256C to the antifuse banks 252 (or to the antifuse bank 254C) to cause the antifuse bank 254C to provide an address 257C as the PPR row address 124. It should be noted that the addresses 257A, 257B, and 257C are addresses associated with repair rows 106 and may be distinct from the latched address 114 or the addresses stored in the antifuse banks 254.

It should be noted that while the repair address match circuitry 255A, 255B, or 255C are illustrated as distinct elements, in some embodiments, a single repair address match circuitry 255 (disposed either internal to the hPPR circuitry 122 or external to and coupled to the hPPR circuitry) may instead be utilized in a manner similar to that described above. For example, the repair address match circuitry 255 may generate a match signal 256 that may represent the results of a comparison of the address signal 40A (or, for example, latched address 114) with the address stored in one or the respective antifuse banks 254A, 254B, and 254C. Use of a single repair address match circuitry 255 might allow for the removal of the logic element 258 (e.g., OR gate) and the match signal 256 generated by the repair address match circuitry 255 could be transmitted directly as the hPPR match signal 126. The match signal 256 generated by the repair address match circuitry 255 could also be transmitted to the antifuse banks 252 (or to the respective antifuse bank 254A, 254B, or 254C) from which the match was generated to cause that antifuse bank 254A, 254B, or 254C to provide an address 257A, 257B, or 257C.

Figure 7:
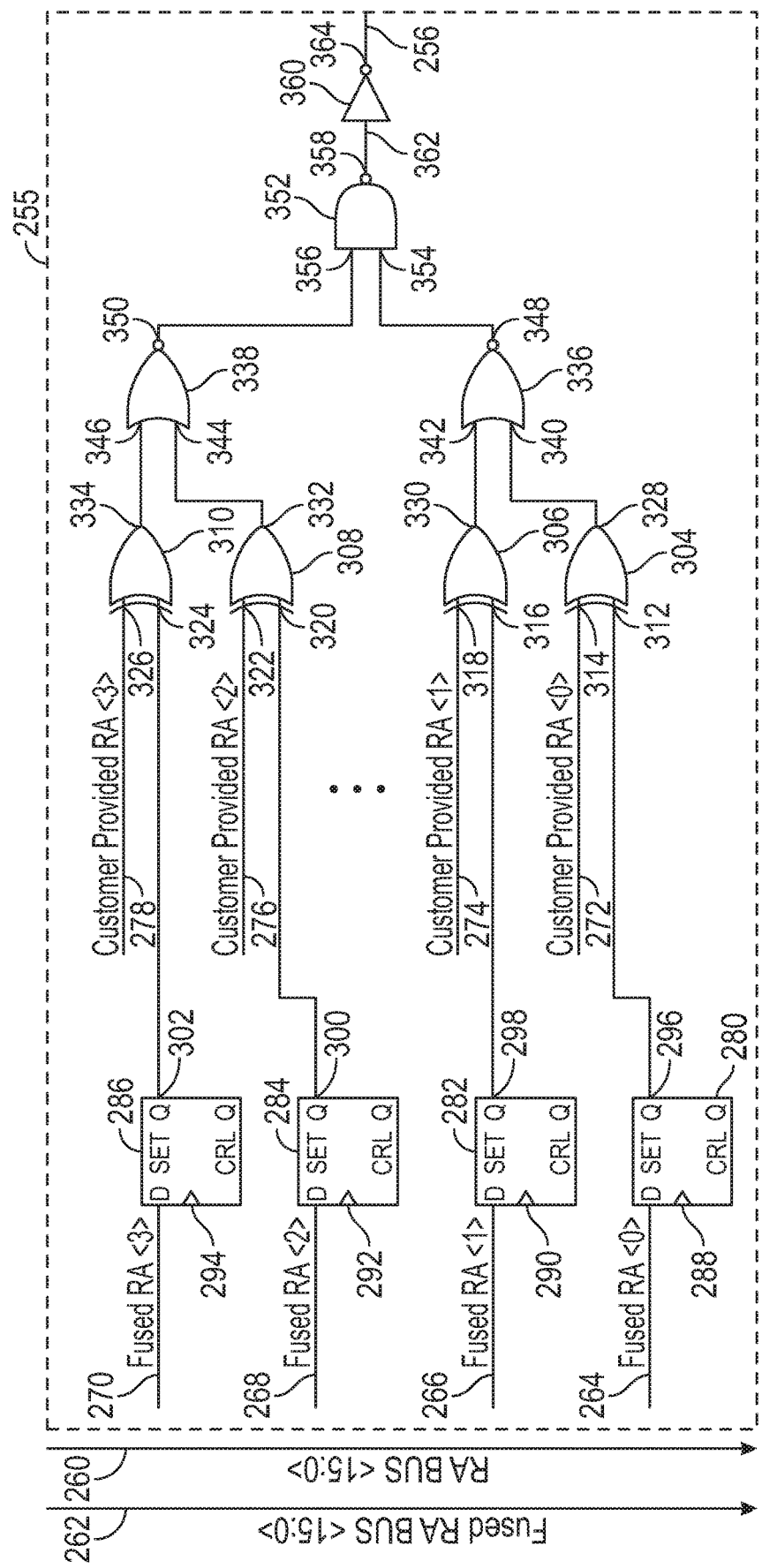
FIG. 7 is a block diagram of a first embodiment of repair address match circuitry that and may be used by memory bank control circuitry such that of FIG. 2, in accordance with an embodiment.

FIG. 7 illustrates an embodiment of the repair address match circuitry 255 of the antifuse/PPR circuitry 122 of FIG. 2. It should be noted that in some embodiments, the repair address match circuitry 255A, 255B, and 255C described above may be similar to the repair address match circuitry 255 illustrated in FIG. 7. Additionally, the sections below describe examples of elements and logic to describe operation of the repair address match circuitry 255. However, it is understood that the elements of FIG. 7 are provided as examples only, and that it is understood that the match logic described below may be implemented in other manners and/or utilizing different logic elements.

In some embodiments, the repair address match circuitry 255 may receive one or more row addresses (e.g., address signal 40A or latched address 114) from, for example, row address (RA) bus 260, which may be coupled to the repair address match circuitry 255. It should be appreciated that the addresses transmitted and/or the size of the RA bus 260 may be determined by the architecture and/or the type of the memory device 10 or the row selection circuitry 100. For purposes of discussion, in the illustrated embodiment, the RA bus 260 includes lines that transmit row address values RA<0> to RA<15>. During operation, a user may provide row addresses and these row addresses are transmitted to a memory bank 12, for example, on every customer activate, in conjunction with a column command for column repair, or in other situations, for example, situations that may be governed by the specifications of the memory device 10. The row addresses may be compared to known defective rows prior to activation or access. As illustrated, the RA bus 260 includes lines that transmit at least a portion of these row addresses, specifically row address values RA<0> to RA<15> as bit values.

Additionally, the repair address match circuitry 255 may receive one or more fused row addresses from, for example, fused RA bus 262, which may be additionally coupled to the repair address match circuitry 255. The fused RA bus 262 may operate to transmit a set of fused addresses, which may be derived from blown fuses that are broadcast or otherwise transmitted from centrally located fuses (e.g., antifuse circuit 163) and which may be latched locally on a power-up, reset, or other initiation of the row selection circuitry 100 and/or the memory device 10. It should be appreciated that the fused addresses transmitted and/or the size of the fused RA bus 262 may be determined by the architecture and/or the type of the memory device 10 or the row selection circuitry 100. For example, in some embodiments, the fused RA bus 262 may be 16 bits wide. For purposes of discussion, in the illustrated embodiment, the fused RA bus 262 includes lines that transmit fused address values Fused RA<0 to Fused RA<15>.

The bits transmitted along the fused RA bus 262 correspond to a defective row or set of rows of the data rows 102. The fuses that correspond to the bits transmitted along the fused RA bus 262 may have been blown at a prior time, for example, during the in-house test flow or via another repair (e.g., hPPR) operation. In some embodiments, not all of the addresses transmitted along the fused RA bus 262 are indicative of a particular repair (i.e., some addresses are potentially DON'T CARE, where a repair for both states of the DON'T CARE bit), and this situation will be discussed below.

As illustrated, the repair address match circuitry 255 includes inputs 264, 266, 268, and 270. The inputs 264, 266, 268, and 270 are coupled to the fused RA bus 262 and each input 264, 266, 268, and 270 receives a respective fused address value: Fused RA<0> at the input 264, Fused RA<1> at the input 266, Fused RA<2> at the input 268, and Fused RA<3> at the input 270. Similarly, the repair address match circuitry 255 includes inputs 272, 274, 276, and 278. The inputs 272, 274, 276, and 278 are coupled to the RA bus 26 and each input 272, 274, 276, and 278 receives a respective row address value: RA<0> at the input 272, RA<1> at the input 274, RA<2> at the input 276, and RA<3> at the input 278. The repair address match circuitry 255 also includes latches (e.g., D-latches) 280, 282, 284, and 286 that operate to respectively receive the respective fused address values, Fused RA<0>, Fused RA<1>, Fused RA<2>, and Fused RA<3> and locally latch the respective fused address values in the repair address match circuitry 255 on powerup. The latches 280, 282, 284, and 286 may output the fused address values, Fused RA<0>, Fused RA<1>, Fused RA<2>, and Fused RA<3> upon receipt of a control signal, such as a clock signal or another signal, at the inputs 288, 290, 292, and 294 of the latches 280, 282, 284, and 286. Upon receipt of a control signal at the input 288, latch 280 may transmit fused address value Fused RA<0> from an output 296 of the latch 280. Similarly, upon receipt of control signals at the inputs 290, 292, and 294, latches 282, 284, and 286 may transmit fused address values Fused RA<1>, Fused RA<2>, and Fused RA<3> from outputs 298, 300, and 302 of the latches 282, 284, and 286, respectively. In some embodiments, the control signals received at the inputs 288, 290, 292, and 294 may be synchronized or may be the same control signal so as to synchronize operation of the latches 280, 282, 284, and 286.

The repair address match circuitry 255 may further include exclusive-OR (XOR) gates 304, 306, 308, and 310 that each include respective inputs 312, 314, 316, 318, 320, 322, 324, and 326. The input 312 of XOR gate 304 may be coupled to the output 296 to receive fused address value Fused RA<0>. The input 314 of XOR gate 304 may be coupled to the input 272 to receive row address value RA<0>. The input 316 of XOR gate 306 may be coupled to the output 298 to receive fused address value Fused RA<1>. The input 318 of XOR gate 306 may be coupled to the input 274 to receive row address value RA<1>. The input 320 of XOR gate 308 may be coupled to the output 300 to receive fused address value Fused RA<2>. The input 322 of XOR gate 308 may be coupled to the input 276 to receive row address value RA<2>. The input 324 of XOR gate 310 may be coupled to the output 302 to receive fused address value Fused RA<3>. The input 326 of XOR gate 310 may be coupled to the input 278 to receive row address value RA<3>. Each of the XOR gates 304, 306, 308, and 310 may generate a result (i.e., a binary signal) based on the binary values of the respective fused address and row address value received by the XOR gate 304, 306, 308, and 310. This result (which may be termed an XOR result or a first level result) may be a binary low value ("0") when the binary value of the bits for both of the respective fused address and row address value received by the XOR gate 304, 306, 308, and 310 have a binary low value ("0") or when the binary value of the bits for both of the respective fused address and row address value received by the XOR gate 304, 306, 308, and 310 have a binary high value ("1"). In all other instances, (i.e., when the fused address and the address have different binary values) the result of the XOR gate 304, 306, 308, and 310 will be a binary high value ("1"). The result generated by the XOR gate 304 will be transmitted from output 328 of the XOR gate 304. Likewise, the results generated by the XOR gates 306, 308, and 310 will be transmitted from output 330 of XOR gate 306, output 332 of XOR gate 308, and output 334 of XOR gate 310.

The results generated by the XOR gates 304, 306, 308, and 310 are transmitted to respective not-OR (NOR) gates 336 and 338 that represent a negation (i.e., inversion) of a digital OR operation. The NOR gates 336 and 338 each include respective inputs 340, 342, 344, and 346. The input 340 of the NOR gate 336 may be coupled to the output 328 to receive the result from the XOR gate 304. The input 342 of the NOR gate 336 may be coupled to the output 330 to receive the result from the XOR gate 306. Likewise, the input 344 of the NOR gate 338 may be coupled to the output 332 to receive the result from the XOR gate 308 and the input 346 of the NOR gate 338 may be coupled to the output 334 to receive the result from the XOR gate 310. Each of the NOR gates 336 and 338 may generate a second result (i.e., a binary signal) based on the binary values of the results generated by the XOR gates 304, 306, 308, and 310. The second result (which may be termed a NOR result or a second level result) may be a binary high value ("1") when the binary value of the bits for both of the results from XOR gates 304 and 306 (or XOR gates 308 and 310) have a binary low value ("0"). In all other instances (i.e., when one or more bit values of the results from respective inputs have a binary high value "1"), the second result generated by the NOR gate 336 and 338 will be a binary low value ("0"). The second result generated by the NOR gate 336 will be transmitted from output 348 of the NOR gate 336. Likewise, the second result generated by the NOR gates 338 will be transmitted from output 350 of the NOR gate 338.

The second results generated by the NOR gates 336 and 338 are transmitted to a not-AND (NAND) gate 352 that represents a negation (i.e., an inversion) of a digital AND operation. NAND gate 352 includes inputs 354 and 356. The input 354 of NAND gate 352 may be coupled to the output 348 to receive the result from NOR gate 336 and the input 356 of NAND gate 352 may be coupled to the output 350 to receive the result from NOR gate 338. NAND gate 352 may generate a third result (i.e., a binary signal) based on the binary values of the results generated by the NOR gates 336 and 338. The third result (which may be termed a NAND result or a third level result) may be a binary low value ("0") when the binary value of the bits for both of the results from NOR gates 336 and 338 have a binary high value ("1"). In all other instances (i.e., when the bit value of one or more results from the NOR gates 336 and 338 have a binary low value "0"), the third result generated by the NAND gate 352 will be a binary high value ("1"). The third result generated by the NAND gate 352 will be transmitted from output 358 of the NAND gate 352.

The third result generated by the NAND gate 352 is transmitted to an inverter 360 that operates to invert the third result. The inverter 360 include input 362 that may be coupled to the output 358 to receive the third result from NAND gate 352 and the inverter 360 may transmit an inverted binary value of the third result from an output 364 of the inverter 360 as match signal 256. In some embodiments, this match signal 256 indicates that the (user provided or customer provided) address signal 40A (or latched address 114) has been repaired. This will re-steer the latched address to a defined functional redundant element, e.g., in repair rows 106). It may be appreciated that the circuitry utilized in the repair address match circuitry 255 is provided as an example and that other circuitry may be utilized in place of the illustrated circuitry to arrive at generation of the match signal 256.

As illustrated in FIG. 7, the RA bus 260 includes lines that transmit row address values RA<0> to RA<15>. However, only row address values RA<0>, RA<1>, RA<2>, RA<3> are compared against fused address values, e.g., Fused RA<0>, Fused RA<1>, Fused RA<2>, Fused RA<3>. By not comparing row address value RA<4>, both states of RA<4> match as being repaired (i.e., row address value RA<4> is a DON'T CARE bit value where its binary value does not impact the repair). This may cause potential issues since, for example, having the row address value RA<4> as a DON'T CARE bit value does not allow for duplicate repair for both states in sPPR (e.g., a seed row may refer to the full row address supplied by a customer during an active cycle for the defective row). This may not allow a user (i.e., a customer) to properly copy data out for the opposite state (e.g., an hPPR follows a manufacturing or supplier repair match, however, the sPPR is unique such that a customer introduces live rows that are not tested with sPPR when blowing in an hPPR repair).

Alternatively, in one embodiment, the row address value RA<4> may instead be a CARE address (where its binary value impacts the repair) and utilized in a separate sPPR match circuit. The separate sPPR match circuit may differ from the repair address match circuitry 255 of FIG. 7 in that the separate sPPR match circuit may be set up to receive the fused address value Fused RA<4> at the input 270 and receive the row address value RA<4> at the input 278 instead of receiving the fused address value Fused RA<3> at the input 270 the row address value RA<3> at the input 278, as illustrated in the repair address match circuitry 255. This allows for comparison of the row address value RA<4> with the fused address value Fused RA<4> (in place of the row address value RA<3> with the fused address value Fused RA<3> in a sPPR match circuit). This makes the row address value RA<3> a DONT CARE bit in the sPPR match circuit. Use of the separate sPPR match circuit described above allows for matching of hPPR and sPPR repair (e.g., an hPPR follows a sPPR match such that a customer introduces live rows that can be tested with sPPR when blowing in a hPPR repair, however, the manufacturing or supplier repair is unique, which may result in portions of the repair rows 106 being unavailable to be used for repair if needed and any yield on memory devices 10 may be reduced).

Figure 8:
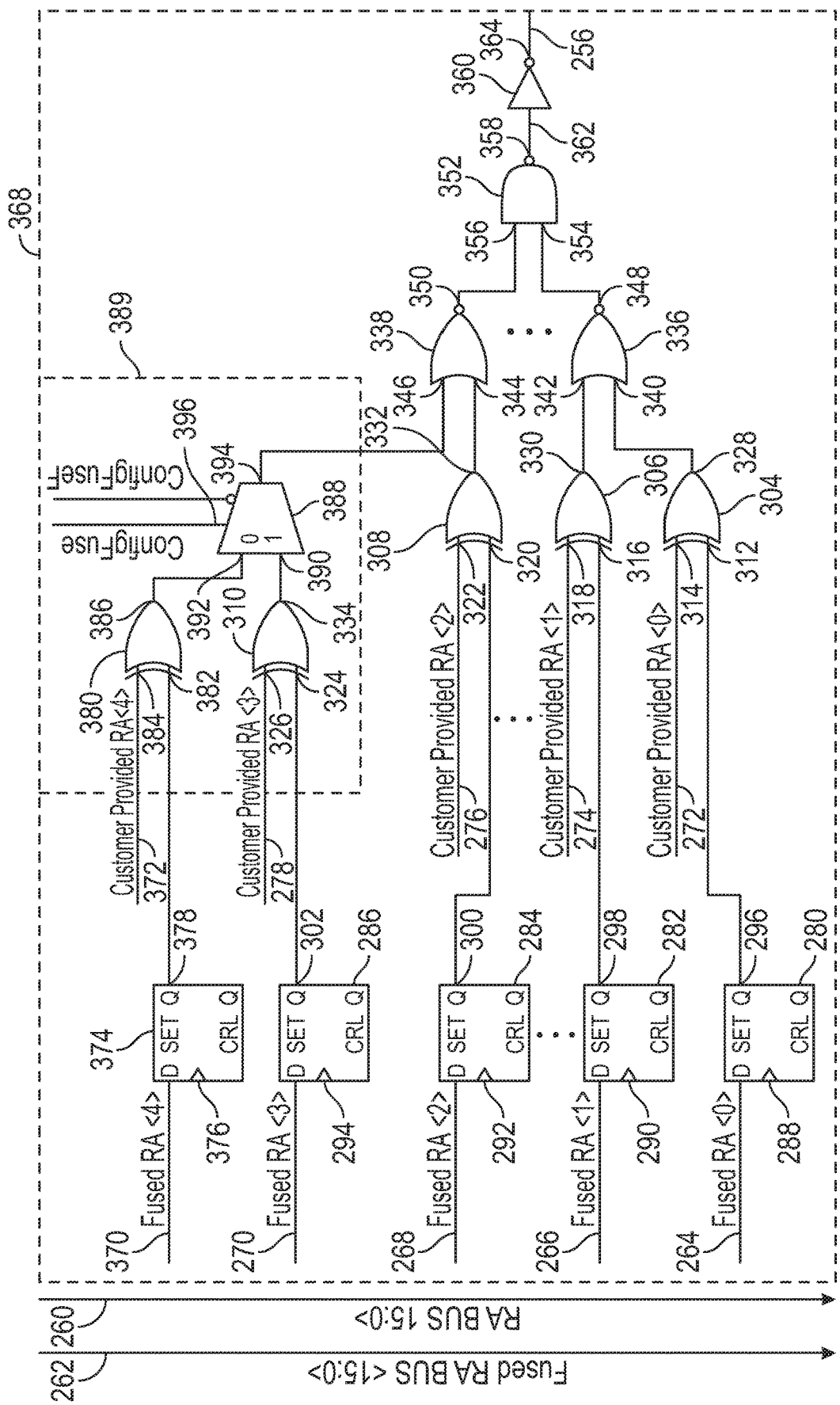
FIG. 8 is a block diagram of a second embodiment of repair address match circuitry that and may be used by memory bank control circuitry such that of FIG. 2, in accordance with an embodiment.

FIG. 8 illustrates repair address match circuitry 368 that may be utilized as an additional and/or alternative embodiment of the repair address match circuitry 255 of FIG. 7. In some embodiments, the repair address match circuitry 368 may be utilized in addition to and/or alternative to the separate sPPR match circuit described above. The sections below describe examples of elements and logic to describe operation of the repair address match circuitry 368. However, it is understood that the elements of FIG. 8 are provided as examples only, and that it is understood that the match logic described below may be implemented in other manners and/or utilizing different logic elements. For example, as previously discussed, the sections below relate to PPR repair operations, but some embodiments may utilize such techniques for other non-PPR repair operations in the memory device 10 by including additional row address flexibility. Regardless of which repair implementations are deployed, the repair address match circuitry 368 may be used to provide flexibility of repairs by enabling dynamic allocation of unused rows for other repairs without creating conflicts thereby increasing yield.

As illustrated, the repair address match circuitry 368 includes inputs 264, 266, 268, 270, and 370. The inputs 264, 266, 268, 270, and 370 are coupled to the fused RA bus 262 and each input 264, 266, 268, 270, and 370 receives a respective fused address value, Fused RA<0> at the input 264, Fused RA<1> at the input 266, Fused RA<2> at the input 268, Fused RA<3> at the input 270, and Fused RA<4> at the input 370. In some embodiments, the Fused RA number (e.g., bit position in the Fused RA BUS 262) of the inputs 264, 266, 268, 270, and 370 indicated herein may each be the same as the position of a corresponding row in a sequence of rows of memory addresses in the memory bank. Alternatively, the Fused RA number may be different than the position of the corresponding row in the sequence of rows of the memory bank. For example, the Fused RA<3> and the Fused RA<4> may denote values other than bit 3 and 4 in the Fused RA Bus<15:0> and/or denote rows other than rows 3 and 4 in a memory bank being addressed. For example, when PPR uses the fifteenth row and/or the second row in a memory bank for PPR and the Fused RA BUS 262 is 16 bits wide, the Fused RA is an encoded row address bus, so a single address may not correspond directly to one bit/row. Row decode from an address to a 'one hot' decoded bus/single row may occur in the memory device 10 after the repair match logic is performed.

Similar to the inputs 264, 266, 268, 270, and 370, the repair address match circuitry 368 includes inputs 272, 274, 276, 278, and 372. In some embodiments, the RA number (e.g., bit position in the RA BUS 260) of the inputs 272, 274, 276, 278, and 372 indicated herein may each be the same as the position of a corresponding row in a sequence of rows of memory addresses in the memory bank. Alternatively, the RA number may be different than the position of the corresponding row in the sequence of rows of the memory bank. Regardless of bit position in the bus and/or corresponding row location, the inputs 272, 274, 276, 278, and 372 are coupled to the RA bus 26 and each input 272, 274, 276, 278, and 372 receives a respective row address value, RA<0> at the input 272, RA<1> at the input 274, RA<2> at the input 276, RA<3> at the input 278, and RA<4> at the input 372 corresponding to a respective row in the memory bank. The repair address match circuitry 368 also includes latches (e.g., D-latches) 280, 282, 284, 286, and 374 that operate to respectively receive the respective fused address values, Fused RA<0>, Fused RA<1>, Fused RA<2>, Fused RA<3>, and Fused RA<4>. The latches 280, 282, 284, 286, and 374 may output the fused address values, Fused RA<0>, Fused RA<1>, Fused RA<2>, Fused RA<3>, and Fused RA<4> upon receipt of a control signal, such as a clock signal or another signal, at the inputs 288, 290, 292, 294, and 376 of the latches 280, 282, 284, 286, and 374.

Upon receipt of a control signal at the input 288, latch 280 may transmit fused address value Fused RA<0> from an output 296 of the latch 280. Similarly, upon receipt of control signals at the inputs 290, 292, 294, and 376, latches 282, 284, 286, and 374 may transmit fused address values Fused RA<1>, Fused RA<2>, Fused RA<3>, and Fused RA<4> from outputs 298, 300, 302, 378 of the latches 282, 284, 286, and 374 respectively. In some embodiments, the control signals received at the inputs 288, 290, 292, 294, and 376 may be synchronized or may be the same control signal so as to synchronize operation of the latches 280, 282, 284, 286, and 374.

The repair address match circuitry 368 may further include XOR gates 304, 306, 308, 310, and 380 that each include the respective inputs 312, 314, 316, 318, 320, 322, 324, 326, 382, and 384. The input 312 of XOR gate 304 may be coupled to the output 296 to receive fused address value Fused RA<0>. The input 314 of XOR gate 304 may be coupled to the input 272 to receive row address value RA<0>. The input 316 of XOR gate 306 may be coupled to the output 298 to receive fused address value Fused RA<1>. The input 318 of XOR gate 306 may be coupled to the input 274 to receive row address value RA<1>. The input 320 of XOR gate 308 may be coupled to the output 300 to receive fused address value Fused RA<2>. The input 322 of XOR gate 308 may be coupled to the input 276 to receive row address value RA<2>. The input 324 of XOR gate 310 may be coupled to the output 302 to receive fused address value Fused RA<3>. The input 326 of XOR gate 310 may be coupled to the input 278 to receive row address value RA<3>. The input 382 of XOR gate 380 may be coupled to output 378 to receive fused address value Fused RA<4> and the input 384 of XOR gate 380 may be coupled to the input 372 to receive row address value RA<4>. Each of the XOR gates 304, 306, 308, 310, and 380 may generate a result (i.e., a binary signal) based on the binary values of the respective fused address and row address value received by the XOR gate 304, 306, 308, 310, and 380. This result (which may be termed an XOR result or a first level result) may be a binary low value ("0") when the binary value of the bits for both of the respective fused address and row address value received by the XOR gate 304, 306, 308, 310, and 380 have a binary low value ("0") or when the binary value of the bits for both of the respective fused address and row address value received by the XOR gate 304, 306, 308, 310, and 380 have a binary high value ("1"). In all other instances (i.e., when the fused address and the address have different binary values), the result of the XOR gate 304, 306, 308, 310, and 380 will be a binary high value ("1"). The result generated by the XOR gate 304 will be transmitted from the output 328 of the XOR gate 304. Likewise, the results generated by the XOR gates 306, 308, 310, and 380 will be transmitted from the output 330 of XOR gate 306, the output 332 of XOR gate 308, the output 334 of XOR gate 310, and the output 386 of XOR gate 380.

Additionally, the repair address match circuitry 368 may include a selection circuit 388 (e.g., a selection element). As illustrated, the selection circuit 388 is part of a dynamic selection subcircuit 389 that includes the XOR gates 310 and 380. The selection circuit 388 may, for example, be a multiplexer that receives the output 334 of XOR gate 310 at an input 390 and receives the output 386 of XOR gate 380 at an input 392. The selection circuit 388 selects one of the binary values of the output 334 of XOR gate 310 and the output 386 of XOR gate 380 to generate as a result transmitted from output 394 of the selection circuit 388. The selection circuit 388 may transmit the result based on a control signal received at a control input 396. The control input 396 may receive a signal (e.g., a selection bit) that corresponds to whether a respective repair was used in testing and repair. In other words, the control input 396 may include a selection address that indicates whether the selection circuitry passes the output 386 or the output 334 for potential memory duplication.

For example, the signal received by the control input 396 may represent when a row (e.g., a repair row 106 or, for example, a redundant row 104) was used in testing and repair, causing a corresponding fuse (e.g., the address match selection fuse 165) to be blown. This address match selection fuse 165 being blown is represented via the transmission of a binary high "1" value as a signal to the control input 396 which, in turn, causes the selection circuit 388 to transmit the output 334 of XOR gate 310 (i.e., the comparison result related to row address RA<3>) as the result from output 394. Similarly, the signal received by the control input 396 may represent when a row (e.g., a repair row 106 or, for example, a redundant row 104) was not used in testing and repair, thereby indicating that the row is available for repairs and causing the address match selection fuse 165 to not to be blown. This address match selection fuse 165 not being blown is represented via the transmission of a binary low "0" value as a signal to the control input 396 (which indicates that since the row was not used in testing and repair, it is available for hPPR). In turn, receipt of the binary low "0" value at the control input 396 causes the selection circuit 388 to transmit the output 386 of XOR gate 380 (i.e., the comparison result related to row address RA<4>) as the result from the output 394 to match the sPPR. As may be appreciated, the disclosure herein uses a particular circuit for discussion with logic high and logic low values. However, some embodiments of the disclosure may include inverse logic with substitute logic elements. For example, AND gates may be used to produce inverted logic from a NAND gate.

The remaining elements of the repair address match circuitry 368 are identical to the elements of the repair address match circuitry 255 and function the same as described above in FIG. 7 with the only exception being that NOR gate 338 receives the result from the output 394 of the selection circuit 388 at the input 346. This result from the output 394 of the selection circuit 388 corresponds to a selected one of the comparison result related to row address RA<3> or the comparison result related to row address RA<4>. This is in contrast to always being the comparison result related to row address RA<3> from output 334, as discussed above with respect to the repair address match circuitry 255 of FIG. 7. Through the use of the additional address match selection fuse 165, a signal indicative of the state of the address match selection fuse 165 being generated as a control signal, and a selection circuit 388 for the selection of the comparison result related to row address RA<3> or the comparison result related to row address RA<4>, the repair address match circuitry 368 may take into account matching of hPPR and sPPR repair when generating the match signal 256 without inclusion of a separate sPPR match circuit. Accordingly, the repair address match circuitry 368 allows for use of all redundant elements (e.g., repair rows 106 or redundant rows 104 and repair rows 106), while still allowing for repair transitions between sPPR and hPPR matching, thus allowing a user to test with sPPR when blowing in a hPPR repair.

Figure 9:
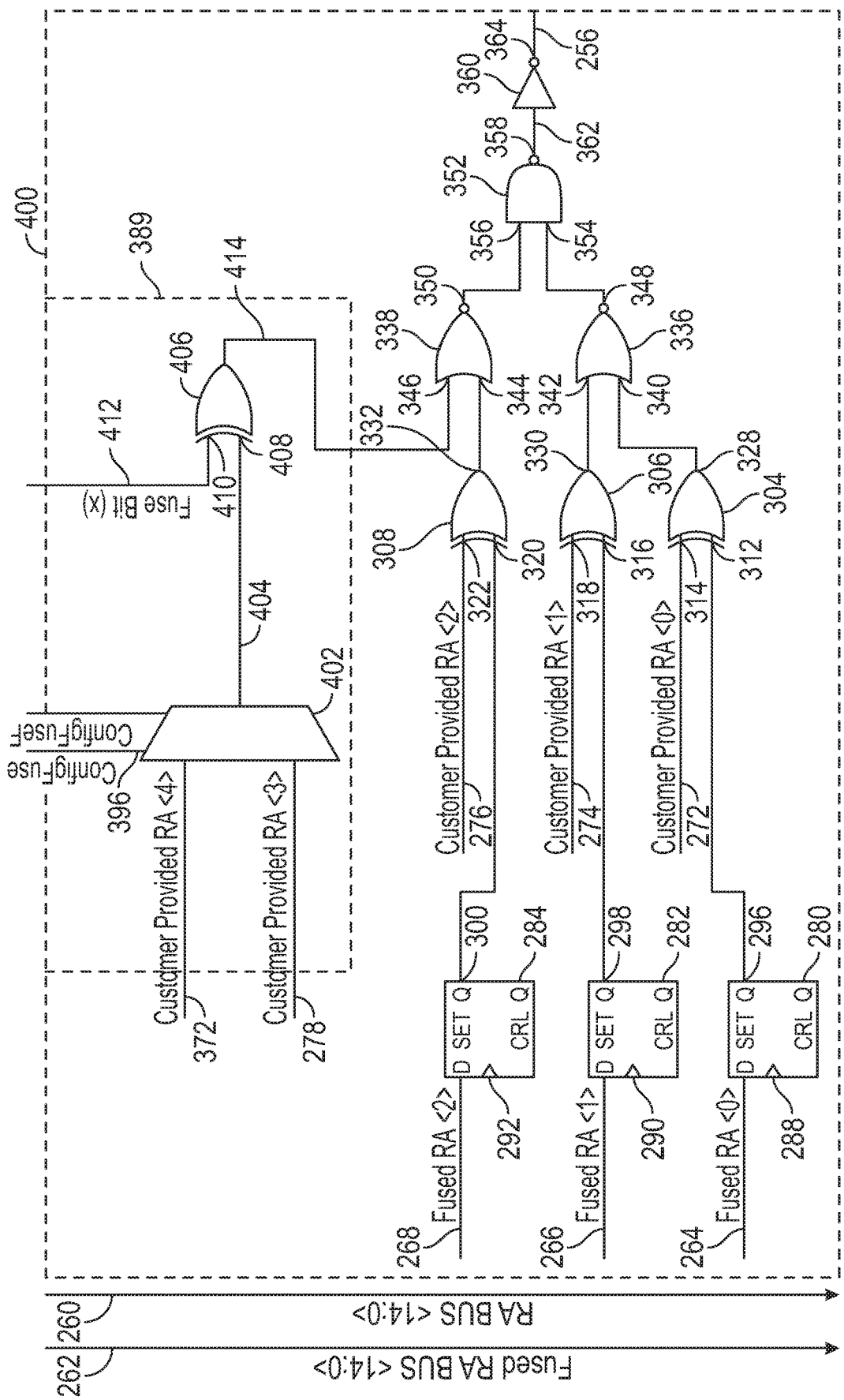
FIG. 9 is a block diagram of a third embodiment of repair address match circuitry that and may be used by memory bank control circuitry such that of FIG. 2, in accordance with an embodiment.

FIG. 9 illustrates repair address match circuitry 400 that functions similarly to the repair address match circuitry 368 of FIG. 8 with a narrower Fused RA Bus 262 and/or a narrower RA Bus 260. However, the repair address match circuitry 400 utilizes a different embodiment of the dynamic selection subcircuit 389 than utilized in the repair address match circuitry 368. The dynamic selection subcircuit 389 of FIG. 9 includes a selection circuit 402 (e.g., selection element). The selection circuit 402 may include a multiplexer. As illustrated, the selection circuit 402 receives the Customer Provided RA<4> 372 and the Customer Provided RA<3> 278 as inputs and selectively outputs the Customer Provided RA<4> 372 or the Customer Provided RA<3> 278 as an output 404 based on the control input 396.

The dynamic selection subcircuit 389 includes an exclusive-OR (XOR) gate 406 that receives the output 404 of the selection circuit 402 at an input 408 of the XOR gate 406. The XOR gate 406 also receives, at an input 410 of the XOR gate 406, a FusedBit(X) signal 412. The FusedBit(X) signal 412 is a fuse value/fused signal (e.g., one or more bits) that is passed to the XOR gate 406 from the Fused RA bus 260. By passing the fuse value/fused signal from the Fused RA bus 260 the selection circuit 402 does not make the determination locally for which fuse to compare in the XOR gate 406. Instead, the control input 396 controls which address is used to compare to the FusedBit(X) signal 412 passed the input 410 of the XOR gate 406. The XOR gate 406 then outputs an output 414. The output 414 is a comparison of the selected output 404 from the selection circuit 402 and the FusedBit(X) signal 412. The output 414 is then transmitted to the input 346 of the NOR gate 338, and the remaining portion of the repair address match circuitry 400.

In other words, the dynamic selection subcircuit 389 receives the Customer Provided RA<4> 372 and the Customer Provided RA<3> 278 as first inputs corresponding to primary sets of addressable groups (e.g., rows) of memory cells. The dynamic selection subcircuit 389 also receives the FusedBit(X) signal 412 as an input of one or more inputs of one or more fused address values of a secondary group of addressable groups (e.g., repair rows), and selects an output based at least in part on a comparison of one or more of the second inputs with a corresponding first input.

Furthermore, the illustrated embodiment of the repair address match circuitry 400 includes only a single dynamic selection subcircuit 389 that receives the Customer Provided RA<4> 372 or the Customer Provided RA<3> 278 and a single fused signal (e.g., FusedBit (X) 412). However, in some embodiments, repairs may utilize additional and/or different rows. For example, in some embodiments, a single repair address match circuitry may receive any number of customer provided row addresses, such as 1, 2, 3, 4, 5, or more that are submitted to the selection circuit 402 to compare to the FusedBit(X) signal 412. Additionally or alternatively, the repair address match circuitry 400 may include more than a single dynamic selection subcircuit 389. For example, in some embodiments, an additional dynamic selection subcircuit 389 may be used to receive the Customer Provided RA<2> 276 among one or more other row addresses. The additional dynamic selection subcircuit 389 may replace the input 268, the latch 284 and the XOR gate 308 to provide the input 344 to the NOR gate 338. Indeed, by including additional flexibility of repairs using additional repair address match circuitries 389 may provide additional flexibility in pre-package and/or post-package repairs of the memory device 10.

Figure 10:
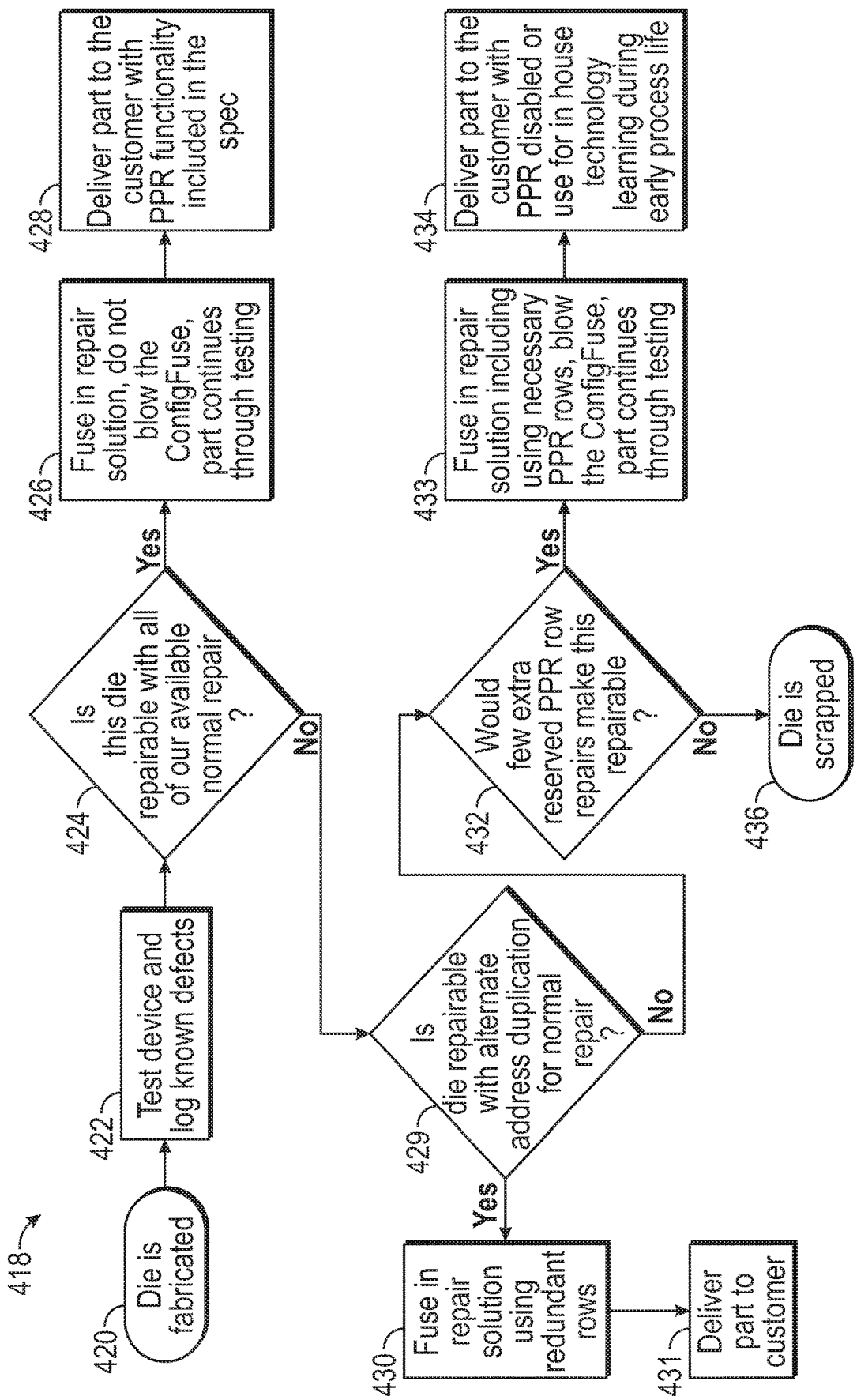
FIG. 10 is a process used to perform memory device repair, in accordance with an embodiment.

FIG. 10 illustrates a flow diagram of a method 418 for testing the memory device 10 that includes the dynamic selection subcircuit 389. The die (i.e., the memory device 10) is fabricated (block 420). The fabricated memory device 10 is then tested with defects logged (block 422). For example, the test may be performed either via an external test device coupled to the memory device 10 or via internal testing circuitry of the memory device 10. Based on the defects determined, a decision is made as to whether the memory device 10 can be repaired using a first repair technique (block 424). For example, the decision may be made via an external test device coupled to the memory device 10 or via internal testing circuitry of the memory device 10. Also, the first repair technique may include a "supplier" or "in-house" repair performed by a manufacturer and/or a supplier as a "normal repair".

If it is determined that the memory device 10 can be repaired using a first repair technique, the first repair technique is undertaken (block 426). This repair technique may be, for example, a pre-package repair in which when a defective row of row 102 is identified, the defective row of row 102 may be deactivated and a redundant row 104 may be used in its place (i.e., redundant row repair). To that end, a non-volatile memory system may store information such as the assigned address of the defective row of row 102, and the address of the redundant row 104 to be used in its place. Once testing and/or repair is completed, the memory device 10 is transferred to a user/customer as having full functionality (block 428).

If it is determined that the memory device 10 cannot be repaired using the first repair technique, a determination of whether die repairable with alternate address duplication for normal repair (block 429). If the die is repairable using the alternate address duplication, the repair is fused using the redundant rows (block 430). In some embodiments, a ConfigFuse may be blown indicating that a repair has been performed using the redundant rows. Once the repair is complete, the part may be delivered to the customer (block 431).

If it is determined that the memory device 10 cannot be repaired using the first or second repair technique, the memory device 10 may be scrapped. However, when the repair address match circuitry 368 in memory device 10 is present and utilized as described above, a third determination may be made (block 432). Namely, a decision is made (e.g., either via an external test device coupled to the memory device 10 or via internal testing circuitry of the memory device 10) as to whether the memory device 10 can be repaired using a third repair technique (e.g., a "PPR" repair or other repair type). The third repair technique may, for example, utilize extra reserved repair rows 106 to make the memory device 10 functional. If it is determined that the memory device 10 can be repaired using the third repair technique, the third repair technique is undertaken (block 433). This third repair technique may include, for example, a fuse in solution in which additional repair rows 106 (e.g., PPR rows or other dedicated repair rows) are utilized when a defective row of data rows 102 is identified, such that the defective row of data rows 102 may be deactivated and a row of repair rows 106 may be used in its place (i.e., PPR row repair). Additionally, a non-volatile memory system may store information such as the assigned address of the defective row of data rows 102, and the address of the row of repair rows 106 to be used in its place. Furthermore, the repairs may include blowing of an address match selection fuse 165 that corresponds to each bank 12 affected.

Once testing and/or repair is completed, the memory device 10 is transferred to a user/customer as having reduced (e.g., partial) repair functionality or without repair functionality (block 434). Additionally, depending on the repair rows 106 used in repair and/or on the overall amount of repair rows 106 present in the memory bank 12, the memory device 10 may be checked (e.g., either via an external test device coupled to the memory device 10 or via internal testing circuitry of the memory device 10) to determine whether there is sufficient repair capability (e.g., sufficient repair rows 106 available) to meet the repair (e.g., PPR) specifications of the memory device 10. In this case, the memory device 10 may be transferred to a user/customer as having full PPR functionality.

Alternatively, the memory device 10 may instead be used for technology learning (e.g., testing by the manufacturer so as to potentially reduce the instances of data row 102 failures on future memory devices 10.) Likewise, for example, if the memory device 10 is an early stage of its process life (e.g., where no parts require customer PPR functionality), the address match selection fuse(s) 165 could be chosen to consistently be blown and so that all of the memory bank(s) 12 of the memory devices 10 might be used for technology learning.

The ConfigFuse used for the alternate address duplication and the PPR repairs may be different fuses for the different repair types. In some embodiments, the decision block 429 and blocks 430 and 431 may be omitted, and the alternate address duplication may be used as part of available normal repair. Finally, if it is determined that the memory device 10 cannot be repaired using the third repair technique, the memory device 10 is scrapped in (block 436).

Alteration of memory devices 10 to allow for matching of sPPR with hPPR row addresses and/or other repair types without compromising manufacturing yield may be attained through the use of the repair address match circuitry 368 and the techniques described with respect to FIGS. 8 and 9. This eliminates situations in which the PPR element (repair rows 106) is forced to always use sPPR optimized row address match circuits (which disallows other repairs, thus reducing yield especially early in the production ramp) and situations in which the PPR element (repair rows 106) utilizes repair address match circuitry 255, which can cause differences in addresses repaired between sPPR and hPPR (whereby potential defects could be introduced to the part in hPPR in which a user cannot view when testing the repair with sPPR). An existing extra address match selection fuse 165 for each memory bank 12 (e.g., as part of an already existing redundant row fuse set) can be utilized to select the match circuit configuration the repair fuse set uses. It should also be appreciated that a unique selection fuse may be additionally and/or alternatively provided per row fuse set or globally per DRAM die, for example, and not just for each memory bank 12.

If a repair row 106 is needed/used for repair in Probe or Burn, the repair may be completed in-house (e.g., by the manufacturer or supplier) in place of scrapping of the memory bank 12 or the memory device 10 as unrepairable. When used, the additional PPR address match selection fuse 165 is blown to indicate that the repair may use the normal row address match configuration and the repair is then used like every other row repair (e.g., Redundant Rows 104). If this PPR element (e.g., repair row 106) is not used in the manufacturing test flow (e.g., blocks 424, 426, and 428), the address match selection fuse 165 will not be blown. This indicates to the memory device 10 that if it is enabled later for PPR, it should use the row address match configuration that is optimized for sPPR seed row addresses. Thus, potential user concern of sPPR not matching hPPR is reduced and/or eliminated while yields related to using PPR elements for typical manufacturing repair are increased.

Figure 11:
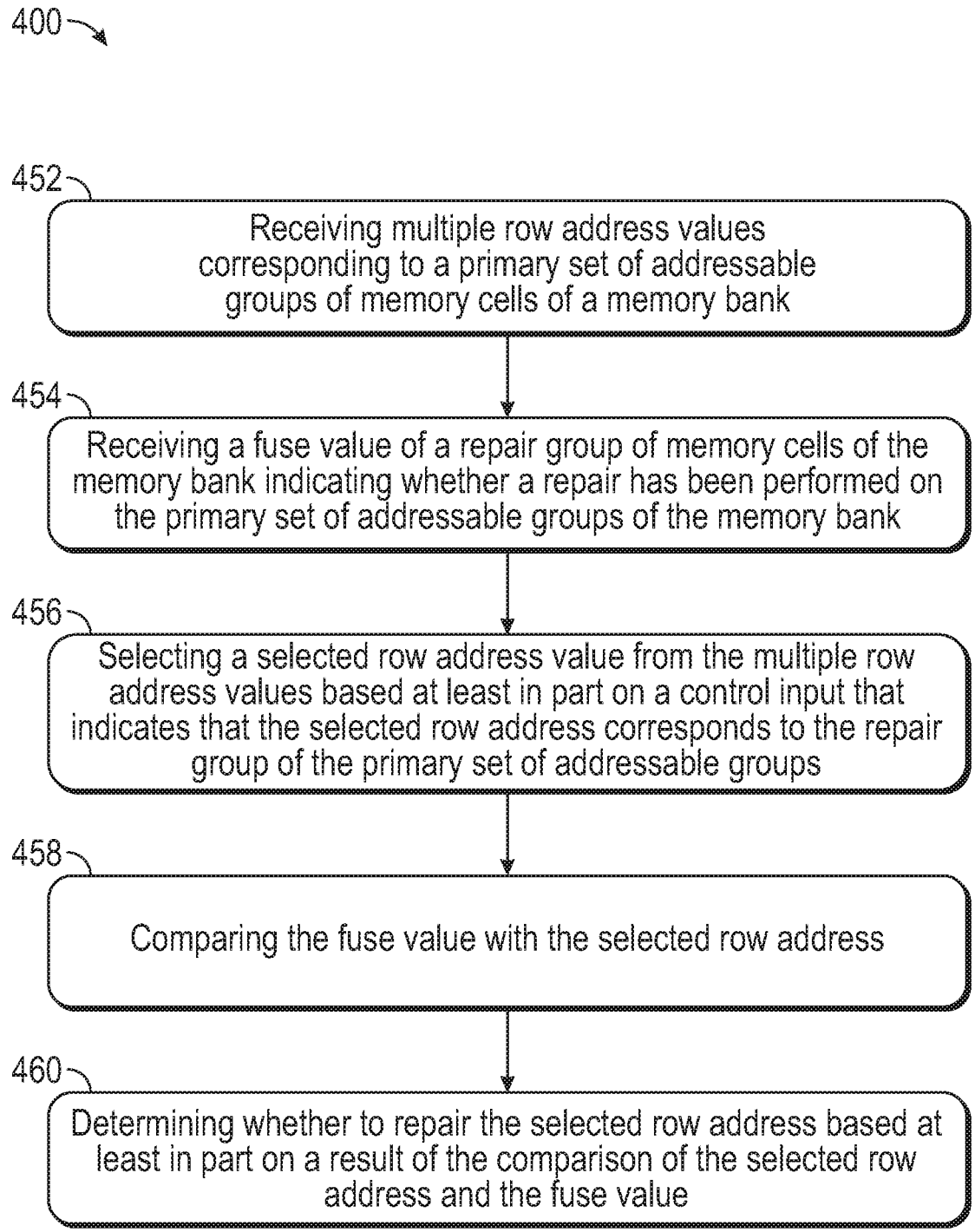
FIG. 11 is a process used to perform memory device repair, in accordance with an embodiment.

FIG. 11 is a process 450 that may utilize the repair address match circuitry 400 of FIG. 9 to perform a repair of a memory device in accordance with the foregoing recitations. The process 400 includes a dynamic selection subcircuit 389 receiving multiple row address values corresponding to a primary set of addressable groups of memory cells of a memory bank (block 452). The dynamic selection subcircuit 389 also receives a fuse value of a repair group of memory cells of the memory bank indicating whether a repair has been performed on the primary set of addressable groups of the memory bank (block 454). The selection element 402 of the dynamic selection subcircuit 389 selects a selected row address value from the multiple row address values based at least in part on a control input that indicates that the selected row address corresponds to the repair group of the primary set of addressable groups (block 456). The selection element 402 may include a multiplexer. The dynamic selection subcircuit 389 then compares the fuse value with the selected row address (block 458). For example, the dynamic selection subcircuit 389 may include the XOR gate 406 to compare the fuse value and the selected row address. The bank controller then determines whether to repair the selected row address based at least in part on a result of the comparison of the selected row address and the fuse value (block 460).

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device, comprising:
a memory bank comprising a plurality of addressable groups of memory cells, wherein the plurality of addressable groups of memory cells comprises a primary set of addressable groups and a secondary set of addressable groups; and
control circuitry configured to activate an addressable group of the memory bank, the control circuitry comprising repair address match circuitry, comprising:
dynamic selection circuitry, comprising:
a plurality of first inputs configured to receive row address values corresponding to the primary set of addressable groups;
one or more second inputs configured to receive one or more fused address values corresponding to the secondary set of addressable groups;
a selection element configured to:
receive one or more of the plurality of the first inputs;
select a selected input of the one or more of the plurality of the first inputs, wherein the selected input comprises a first input of the one or more of the plurality of the first inputs and remaining inputs of the one or more of the plurality of the first inputs comprises a second input of the one or more of the plurality of inputs when a first control input is received by the selection element, and wherein the selected input comprises the second input and the remaining inputs comprise the first input when a second control input is received by the selection element;
transmit the selected input while blocking the remaining inputs from being transmitted; and
comparison circuitry configured to compare the first input to the one or more second inputs.

2. The memory device of claim 1, wherein the plurality of addressable groups comprises a plurality of rows of the memory cells or a plurality of columns of the memory cells.

3. The memory device of claim 1, wherein the primary set of addressable groups comprises groups of data cells configured to store data in a primary location, and the secondary set of addressable groups comprises repair cells configured to store data in a secondary location when a corresponding at least a portion of the primary set of addressable groups have been repaired.

4. The memory device of claim 1, wherein the selection element comprises a multiplexer.

5. The memory device of claim 1, wherein the first and second control inputs are indicative of whether corresponding fuses are blown in the memory device.

6. The memory device of claim 1, wherein the first and second control inputs are indicative of whether repairs utilizing corresponding portions of the secondary set of addressable groups were completed.

7. The memory device of claim 6, wherein the repairs have been performed by a manufacturer of the memory device or during a post-package repair (PPR).

8. The memory device of claim 1, wherein the dynamic selection circuitry comprises an exclusive OR (XOR) gate configured to receive one of the plurality of first inputs and the one or more second inputs to compare the one of the plurality of first inputs and the one or more second inputs.

9. The memory device of claim 1, wherein comparison circuitry is configured to generate a match signal based at least in part on a result of the comparison.

10. The memory device of claim 9, wherein the control circuitry is configured to determine whether to repair the primary set of addressable groups based at least in part on the match signal.

11. A memory bank controller comprising:
a memory bank comprising a plurality of memory cells in a plurality of data rows and a plurality of repair rows;
address match circuitry comprising:
a selection element configured to:
receive addresses of the plurality of data rows;
select a data row address of the plurality of data rows based on a control input configured to indicate which of the plurality of data rows is to be compared to a corresponding fused signal indicative of whether a repair has been previously been performed; and
transmit the selected data row address while blocking unselected data rows of the plurality of data rows from the comparison, wherein the selected data row address comprises a first row address of the plurality of data rows and the unselected data rows comprises a second row address of the plurality of data rows when a first control input is received by the selection element, and wherein the selected data row address comprises the second row address and the unselected data rows comprise the first row address when a second control input is received by the selection element; and
a comparison element configured to:
receive the selected row address from the selection element;
compare the selected data row address with the corresponding fused signal; and
output a result of the comparison indicative of whether a repair is available.

12. The memory bank controller of claim 11, wherein the memory bank comprises a fuse circuit comprising a plurality of fuses configured to store indications of whether repair rows of the plurality of repair rows have been utilized in place of corresponding data rows, and the corresponding fused signal is received from a fuse circuit.

13. The memory bank controller of claim 11, wherein the corresponding fused signal is received from a host device.

14. The memory bank controller of claim 11, wherein the corresponding fused signal comprises a single bit.

15. A method, comprising:
receiving a plurality of row address values corresponding to a primary set of addressable groups of memory cells of a memory bank;
receiving a fuse value of a repair group of memory cells of the memory bank indicating whether a repair has been performed on the primary set of addressable groups of the memory bank;
selecting, using a selection element, a selected row address value from the plurality of row address values based at least in part on a control input that indicates that the selected row address corresponds to the repair group of the primary set of addressable groups;
transmitting, by the selection element, the selected row address while blocking unselected row addresses of the plurality of row address values from being transmitted, wherein the selected row address comprises a first row address of the plurality of row address values and the unselected row addresses comprise a second row address of the plurality of row address values when a first control input is received by the selection element, and wherein the selected row address comprises the second row address and the unselected row addresses comprise the first row address when a second control input is received by the selection element;

comparing the fuse value with the selected row address; and determining whether to repair the selected row address based at least in part on a result of the comparison of the selected row address and the fuse value.

16. The method of claim 15, wherein the comparison is an exclusive OR (XOR) of the selected row address and the fuse value.

17. The method of claim 15, comprising receiving the fuse value from a fuse circuit of a memory controller that includes the memory bank or from a host device coupled to a memory device that includes the memory bank.

18. The method of claim 15, wherein the repair comprises an in-house repair or a post-package repair (PPR).

19. The method of claim 15, wherein the selection element comprises a multiplexer.

20. The method of claim 15, wherein the first and second control inputs are received from a host device coupled to a memory device comprising the memory bank.

* * * * *